(12) United States Patent
Park et al.

(10) Patent No.: US 9,894,766 B2
(45) Date of Patent: Feb. 13, 2018

(54) DISPLAY APPARATUS

(71) Applicant: SAMSUNG ELECTRONICS CO., LTD., Suwon-si (KR)

(72) Inventors: Cheon Ho Park, Yongin-si (KR); Jong-Hoi Kim, Suwon-si (KR); Han Mi Choi, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/149,541

(22) Filed: May 9, 2016

(65) Prior Publication Data

US 2016/0330838 A1 Nov. 10, 2016

(30) Foreign Application Priority Data

May 8, 2015 (KR) ........................ 10-2015-0064241

(51) Int. Cl.
*G09F 13/04* (2006.01)
*G09F 13/08* (2006.01)
(Continued)

(52) U.S. Cl.
CPC .............. *H05K 1/142* (2013.01); *F21V 7/05* (2013.01); *G02F 1/133603* (2013.01); *G02F 1/133608* (2013.01); *F21Y 2101/00* (2013.01); *F21Y 2105/10* (2016.08); *F21Y 2115/10* (2016.08); *G02F 1/133605* (2013.01); *G02F 2001/133607* (2013.01); *H05K 2201/09045* (2013.01);
(Continued)

(58) Field of Classification Search
CPC ......... H05K 1/142; H05K 2201/09045; H05K 2201/10121; H05K 2201/10106; G02F 1/133603; G02F 1/133608; G02F 1/133605; G02F 2001/133607; F21V 7/05; F21Y 2103/003; F21Y 2101/02; F21Y 2105/003
See application file for complete search history.

(56) References Cited

U.S. PATENT DOCUMENTS 4,909,627 A 3/1990 Brousseau
2010/0085512 A1 4/2010 Ueda et al.
(Continued)

FOREIGN PATENT DOCUMENTS

CN 104100886 A 10/2014
EP 2 811 336 A2 12/2014
(Continued)

OTHER PUBLICATIONS

Communication dated Sep. 20, 2016 issued by the European Patent Office in counterpart European Patent Application No. 16166915.5.
(Continued)

*Primary Examiner* — Donald Raleigh
(74) *Attorney, Agent, or Firm* — Sughrue Mion, PLLC

(57) ABSTRACT

A display apparatus includes: a display panel; a chassis including a flat part and an inclined part that extends from a side border of the flat part and is inclined with respect to the flat part; at least one printed circuit board (PCB) disposed on the chassis; and a plurality of light sources arranged on the at least one PCB and configured to emit light toward the display panel, wherein at least one light source of the plurality of light sources is arranged at a position corresponding to the inclined part of the chassis.

19 Claims, 20 Drawing Sheets

(51) Int. Cl.
    *H05K 1/14*           (2006.01)
    *F21V 7/05*           (2006.01)
    *G02F 1/1335*        (2006.01)
    *F21Y 101/00*        (2016.01)
    *F21Y 105/10*        (2016.01)
    *F21Y 115/10*        (2016.01)

(52) U.S. Cl.
    CPC .............. *H05K 2201/10106* (2013.01); *H05K 2201/10121* (2013.01)

(56) References Cited

U.S. PATENT DOCUMENTS

2013/0223079 A1*   8/2013   Jung ..................... F21S 8/02
                                                          362/297
2014/0354914 A1* 12/2014   Lee ................. G02F 1/133608
                                                          349/58
2015/0378212 A1* 12/2015   Jia .................... G02F 1/133602
                                                          362/97.1

FOREIGN PATENT DOCUMENTS

EP          2 811 336 A3    12/2014
KR    10-2014-0076719 A   6/2014

OTHER PUBLICATIONS

Communication dated Jul. 4, 2017, issued by the European Patent Office in counterpart European Application No. 16166915.5.

* cited by examiner

DISPLAY APPARATUS

CROSS-REFERENCE TO RELATED APPLICATION

This application claims priority from Korean Patent Application No. 2015-0064241, filed on May 8, 2015 in the Korean Intellectual Property Office, the disclosure of which is incorporated herein by reference.

BACKGROUND

1. Field

Apparatuses consistent with exemplary embodiments relate to a display apparatus, and more particularly, to structure of a backlight unit of irradiating light.

2. Description of the Related Art

In general, a display module of a display apparatus, such as a monitor and a television, includes a display panel to display images.

A liquid crystal display (LCD) panel is widely used as such a display panel. However, since an LCD panel cannot itself emit light, a backlight unit is disposed behind the display panel, and a diffusion plate is disposed between the display panel and the backlight unit to diffuse light radiated from the backlight unit so as to uniformly distribute the light to the entire area of the display panel.

The display module may also include a reflective sheet disposed inside a bottom chassis forming a rear side of the display module to again reflect light reflected toward the bottom chassis toward the display panel.

In order to transmit light generated from the backlight unit and the reflective sheet to the entire area of the display panel, a predetermined optical distance is required.

However, as display apparatuses become slimmer, the optical distance between the backlight unit and the display panel is reduced, which causes a problem that light cannot be uniformly radiated to the entire area of the display panel.

SUMMARY

One or more exemplary embodiments provide a backlight unit configured to radiate light onto the entire area of a display panel in a slim display apparatus.

One or more exemplary embodiments also provide an additional reflective sheet configured to transmit light to the entire area of a display panel.

According to an aspect of an exemplary embodiment, there is provided a display apparatus including: a display panel; a chassis including a flat part and an inclined part that extends from a side border of the flat part and is inclined with respect to the flat part; at least one printed circuit board (PCB) disposed on the chassis; and a plurality of light sources arranged on the at least one PCB and configured to emit light toward the display panel, wherein at least one light source of the plurality of light sources is arranged at a position corresponding to the inclined part of the chassis.

The at least one PCB may extend across the flat part of the chassis in a longitudinal direction of the chassis to a part of the inclined part of the chassis.

The at least one PCB may include a first section corresponding to the flat part, and a second section that is inclined corresponding to the inclined part of the chassis.

The second section may be inclined at an angle of 8 degrees to 15 degrees with respect to the first section.

The plurality of light sources may be arranged at intervals along a longitudinal direction of the at least one PCB, and the at least one light source of the plurality of light sources may be arranged in the second section.

The at least one PCB may include a first PCB disposed on the flat part of the chassis, and a second PCB disposed on the inclined part of the chassis.

The second PCB may be disposed on the inclined part has a longer side in a height direction of the chassis, and be positioned in the height direction of the chassis.

The at least one light source may include a plurality of light sources arranged on the second PCB at intervals in a height direction of the chassis.

The display apparatus may further include a plurality of lenses respectively installed on the plurality of light sources, wherein a diameter of at least one lens, among the plurality of lenses, installed on the at least one light source arranged on the portion of the at least one PCB which is disposed on the inclined part is greater than diameters of other lenses, among the plurality of lenses, installed on other light sources of the plurality of light sources arranged on a portion of the at least one PCB which is disposed on the flat part.

A thickness of the at least one lens may be thicker than thicknesses of the other lenses.

The display apparatus may further include: a first reflective sheet disposed on the chassis, and configured to reflect light emitted by the plurality of light sources toward the display panel; and a second reflective sheet disposed between the first reflective sheet and the display panel.

The second reflective sheet may be located at a position corresponding to the inclined part, and include a plurality of through holes through which light emitted by the plurality of light sources and light reflected by the first reflective sheet are transmitted.

The plurality of through holes may be arranged in a center part and an edge part of the second reflective sheet, and diameters of the plurality of through holes arranged in the center part of the second reflective sheet may be smaller than diameters of the plurality of through holes arranged in the edge part of the second reflective sheet.

The diameters of the plurality of through holes increase in a direction from the center part of the second reflective sheet to the edge part of the second reflective sheet.

According to an aspect of another exemplary embodiment, there is provided a display apparatus including: a display panel; and a backlight unit including a plurality of light sources configured to emit light toward the display panel, wherein a first section of the backlight unit is disposed on a plane parallel to the display panel, a second section of the backlight unit extends from a border of the first section and is inclined with respect to the first section, and the plurality of light sources are arranged on the first section and the second section.

The backlight unit may extend in a width direction of the display panel.

The backlight unit may further include a plurality of lenses respectively installed on the plurality of light sources, and configured to diffuse light emitted by the plurality of light sources, and at least one lens arranged on the second section of the PCB diffuses a larger amount of light than a plurality of lenses arranged on the first section of the PCB.

According to an aspect of another exemplary embodiment, there is provided a display apparatus including: a display panel; and a plurality of backlight unit, each of the plurality of backlight units including a plurality of light sources configured to emit light toward the display panel, wherein a first backlight unit, among the plurality of backlight unit, is disposed on a first plane parallel to the display panel and extends in a width direction of the display panel, and a second backlight unit, among the plurality of the backlight units, is disposed on a second plane inclined with respect to the first plane and extends in a height direction of the display panel.

Each of the first and second backlight units may further include a plurality of lenses respectively installed on the plurality of light sources, and configured to diffuse light generated from the plurality of light sources, and the lenses of the second backlight unit may diffuse a larger amount of light than the lenses of the first backlight unit.

According to an aspect of another exemplary embodiment, there is provided display apparatus including: a display panel; a chassis including a flat part and an inclined part that extends from a side edge of the flat part and is inclined with respect to the flat part; a printed circuit board (PCB) disposed on the chassis; a plurality of light sources arranged on the PCB and configured to emit light, wherein at one light source of the plurality of light sources is arranged on at a position corresponding to the inclined part of the chassis so that the at least one light source is inclined with respect to the other light sources; a first reflective sheet disposed behind the plurality of light sources, and configured to reflect the light emitted from the plurality of light sources toward the display panel; and a second reflective sheet disposed between the display panel and the first reflective sheet, and configured to reflect light emitted from the plurality of light sources and the light reflected by the first reflective sheet to the first reflective sheet.

BRIEF DESCRIPTION OF THE DRAWINGS

The above and/or other aspects will become apparent and more readily appreciated from the following description of exemplary embodiments, taken in conjunction with the accompanying drawings of which.

DETAILED DESCRIPTION

Figure 1:
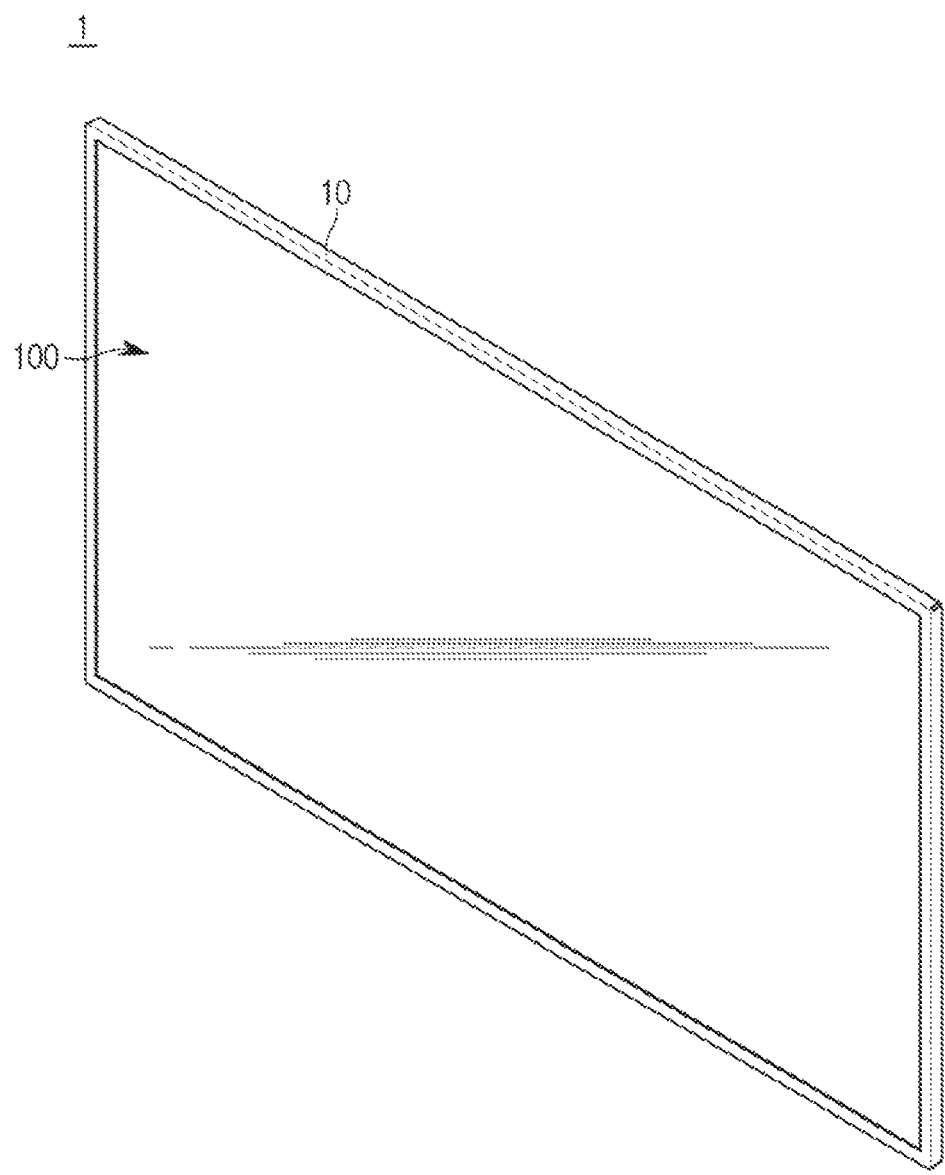
FIG. 1 is a perspective view of a display apparatus according to an exemplary embodiment.

Configurations illustrated in the embodiments and the drawings described in the present specification are merely exemplary, and thus it is to be understood that various modified examples, which may replace the embodiments and the drawings described in the present specification, are possible.

Also, like reference numerals or symbols denoted in the drawings of the present specification represent members or components that perform the substantially same functions.

The terms used in the present specification are used to describe the exemplary embodiments. Accordingly, it should be apparent to those skilled in the art that the following description of exemplary embodiments is provided for illustration purpose only and not for the purpose of limiting the inventive concept as defined by the appended claims and their equivalents. It is to be understood that the singular forms "a," "an," and "the" include plural referents unless the context clearly dictates otherwise. It will be understood that when the terms "includes," "comprises," "including," and/or "comprising," when used in this specification, specify the presence of stated features, figures, steps, components, or combination thereof, but do not preclude the presence or addition of one or more other features, figures, steps, components, members, or combinations thereof.

Hereinafter, exemplary embodiments will be described in detail with reference to the accompanying drawings.

In the following description, the terms "front part" and "front direction" mean the front part of a display apparatus shown in FIG. 1 and a direction toward the front part of the display apparatus, respectively, and also, the term "rear direction" means a direction toward the rear part of the display apparatus 1.

The following description will be given under an assumption that the display apparatus 1 is a flat panel display apparatus, however, the display apparatus 1 may be a curved display apparatus or a bendable or flexible display apparatus that can change its state between a flat state and a curved state.

Also, the present disclosure can be applied to all kinds of display apparatuses regardless of their screen sizes. For example, the present disclosure can be applied to a product, such as a smart television, a monitor, and the like, which can be put on a table, a wall, a ceiling, etc., or to a portable product, such as a tablet Personal Computer (PC), a laptop computer, a smart phone, e-book, and the like.

Figure 2:
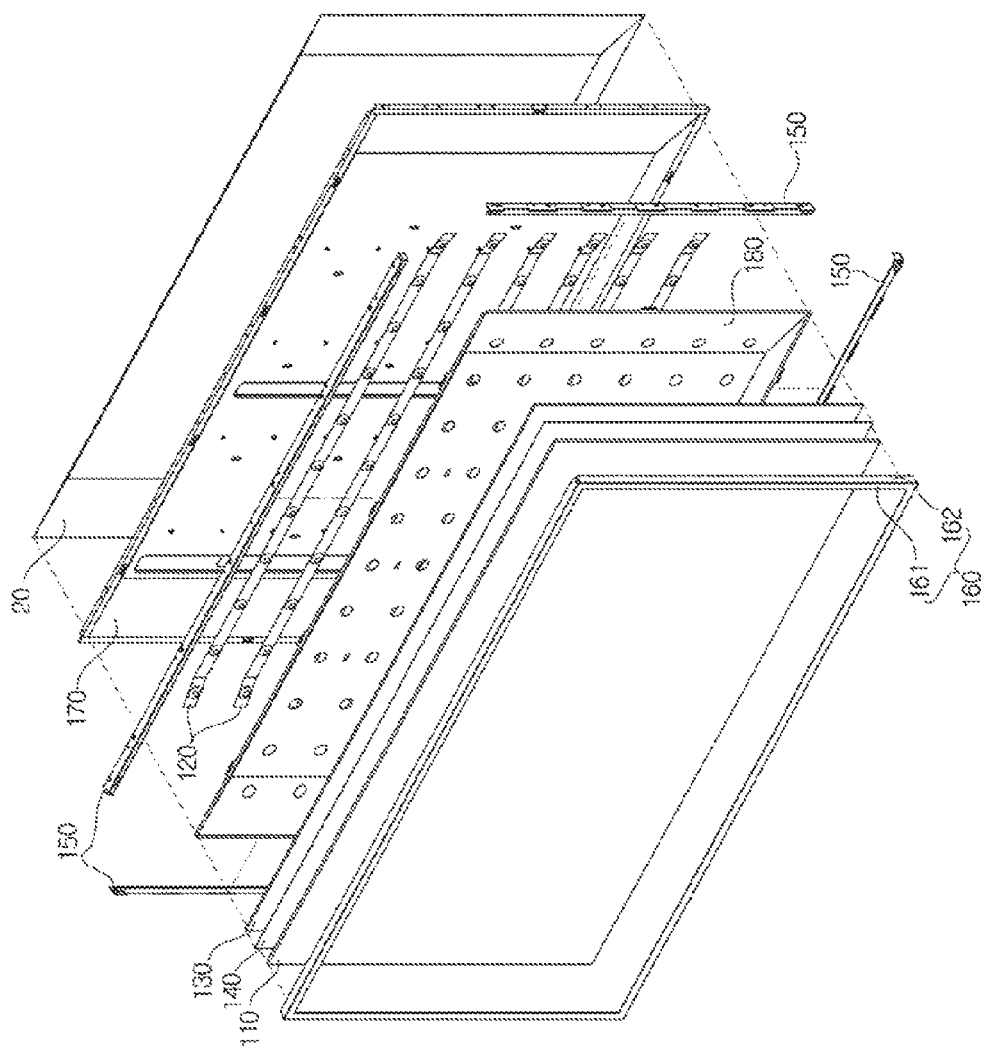
FIG. 2 is an exploded perspective view showing a display module and a rear case of a display apparatus according to an exemplary embodiment.
Figure 3:
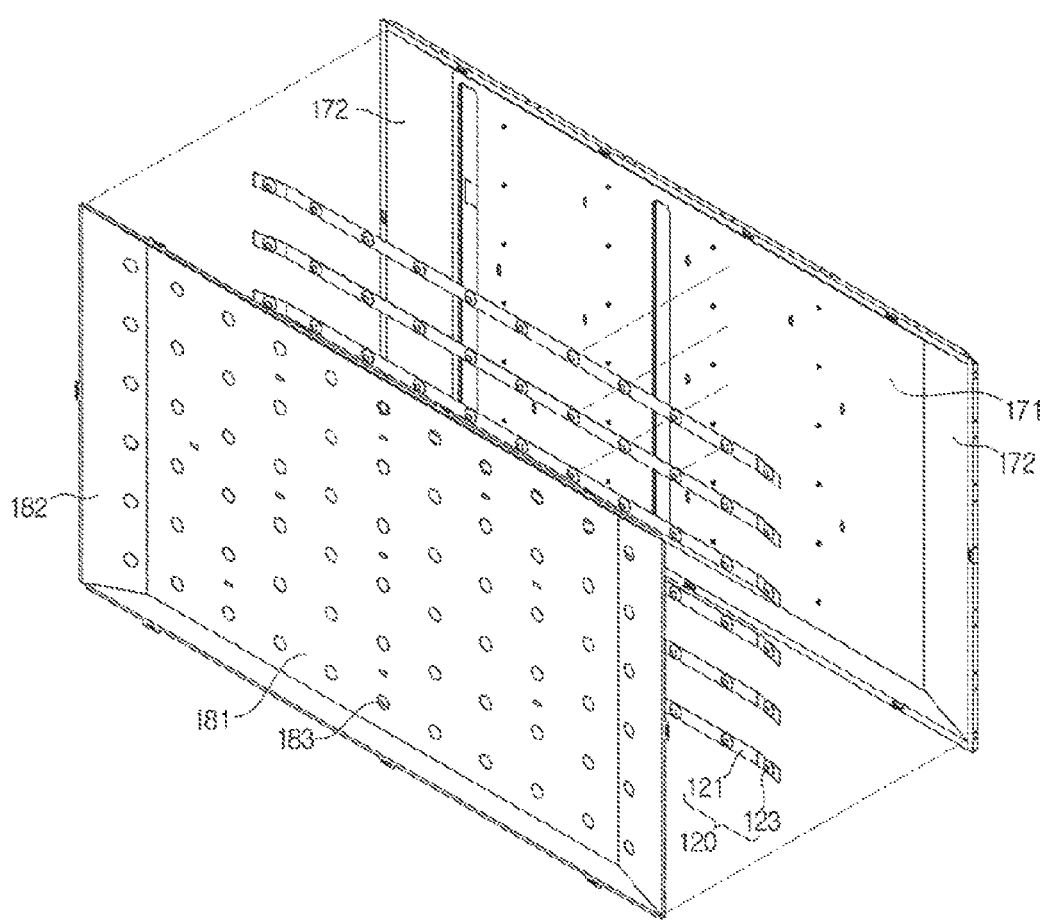
FIG. 3 is an exploded perspective view showing a configuration of a part of a display module according to an exemplary embodiment.

FIG. 1 is a perspective view of a display apparatus according to an exemplary embodiment, FIG. 2 is an exploded perspective view showing a display module and a rear case of the display apparatus according to an exemplary embodiment, and FIG. 3 is an exploded perspective view showing a configuration of a part of the display module according to an exemplary embodiment.

A display apparatus 1 may include, as shown in FIGS. 1 and 2, a display module 100 configured to display images, a front case 10 and a rear case 20 which are coupled with each other in a front and back direction and which the display module 100 is disposed in between, and a control board disposed between the display module 100 and the rear case 20, and configured to transfer a supply voltage and signals to the display module 100.

The display module 100 may include, as shown in FIGS. 2 and 3, a display panel 110 formed as an LCD panel to display a screen, a backlight unit 120 disposed behind the display panel 110 to be spaced from the display panel 110, and configured to supply light to the display panel 110, a diffusion plate 130 disposed behind the display panel 110, and configured to diffuse light radiated from the backlight unit 120 to transfer the diffused light to the display panel 110, and various kinds of optical sheets 140 disposed in front of the diffusion plate 130.

Further, the display module 100 may include a middle mold 150 configured to support the display panel 110 and the diffusion plate 130, a top chassis 160 disposed in front of the middle mold 150 such that the display panel 110 is maintained to be installed in the middle mold 150, and a bottom chassis 170 disposed behind the middle mold 150, the bottom chassis 170 in which the backlight unit 120 is disposed.

Figure 6:
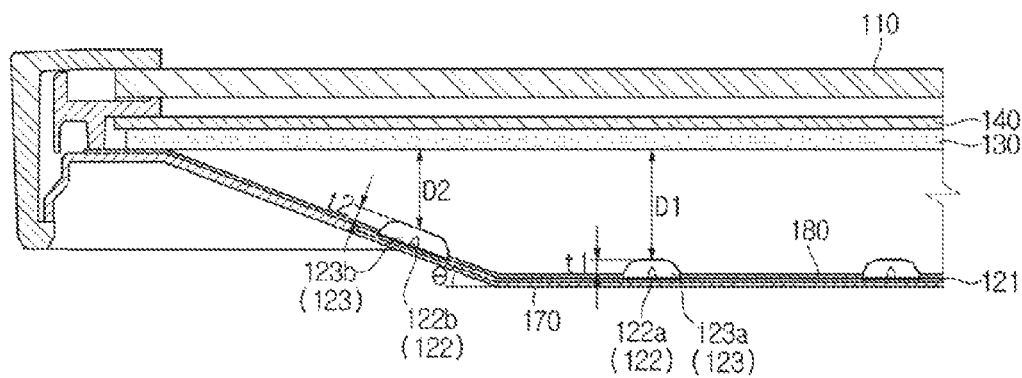
FIG. 6 is an enlarged cross-sectional view showing a configuration of a part of a display module according to an exemplary embodiment.

The backlight unit 120 may include a plurality of printed circuit boards (PCBs) 121 on each of which a conductive pattern is formed and which are disposed on the bottom chassis 170, a plurality of light sources 122 arranged on the front surfaces of the PCBs 121 to face the diffusion plate 130, and a plurality of circular lenses 123 installed on the light sources 122 to diffuse light generated from the light sources 122 (see FIG. 6).

According to an exemplary embodiment, the light sources 122 may be light-emitting diodes (LEDs). However, the light sources 122 are not limited to LEDs, and may be any other devices capable of irradiating light.

In the current embodiment, the PCBs 121 may extend in the width direction of the display panel 110 in correspondence to the display panel 110, and the PCBs 121 may be arranged with intervals in parallel. On each PCB 121, a plurality of light sources 122 and a plurality of lenses 123 installed on the individual light sources 122 may be arranged with intervals in the length direction of the PCB 121, wherein the PCBs 121 may be connected to each other through a connection board.

Each optical sheet 140 may include a prism film to focus light diffused by the diffusion plate 130 in a direction that is vertical to the display panel 110. Also, a protective film for protecting the optical sheet 140 may be additionally provided to contact the optical sheet 140.

The middle mold 150 may support components, such as the display panel 110 and the diffusion plate 130, wherein the display panel 110 may be disposed in the front part of the middle mold 150 and the diffusion plate 130 may be disposed in the back part of the middle mold 150 (see FIG. 6).

According to an exemplary embodiment, the middle mold 150 may be assembled at the lateral sides of the display module 100 in such a way to be removably coupled with the display module 100. However, the middle mold 150 may be integrated into the display module 100 in the shape of a frame.

The top chassis 160 may include a bezel part 161 to cover the edges of the front part of the display panel 110, and a side part 162 bent from the outer borders of the bezel part 161 toward the back part of the display module 100.

The bottom chassis 170 may include a flat part 171 having a nearly rectangular shape and provided in the shape of a flat plate in the center portion of the bottom chassis 170 such that a part of the backlight unit 120 rests on the flat part 171, and an inclined part 172 extending outward from the borders of the flat part 171 and inclined toward the front part of the display module 100. In the flat part 171 and the inclined part 172, a plurality of resting grooves may be concavely formed through which the PCBs 121 of the backlight unit 120 can be rested on the bottom chassis 170.

Also, the display module 100 may include a first reflective sheet 180 disposed on the inner surface of the bottom chassis 170, and configured to reflect light radiated toward the inner surface of the bottom chassis 170 toward the display panel 110.

The first reflective sheet 180 may include a sheet flat part 181 disposed on the inner surface of the flat part 171 of the bottom chassis 170, and a sheet inclined part 182 extending outward from the borders of the sheet flat part 181 and inclined with respect to the sheet flat part 181 in the front direction.

In the sheet flat part 181, a plurality of through holes 183 may be respectively formed to correspond to the plurality of light sources 122 and the plurality of lenses 123 so that the plurality of light sources 122 and the plurality of lenses 123 pass through the through holes 183 to protrude toward the inside of the first reflective sheet 180. Accordingly, light generated by the light sources 122 may be transferred to the display panel 110 disposed in the front direction, and light reflected backward by the diffusion plate 130 and a second reflective sheet 190 which will be described later may be again reflected in the front direction by the first reflective sheet 180.

The sheet inclined part 182 may extend forward from the borders of the sheet flat part 181, that is, from the upper, lower, left, and right edges of the sheet flat part 181, and be inclined to face the rear surface of the display panel 110 so as to reflect light transferred from the light sources 122 in the front direction. In the current embodiment, since the diffusion plate 130 is positioned behind the display panel 110, the sheet inclined part 182 may be inclined to face the rear surface of the diffusion plate 130.

In the display module 100, if the light sources 122 are arranged only on the flat part 171, the peripheral portions of the display panel 110 may receive a relatively small amount of light as compared to a central portion, so that a shadow area that is darker than the central portion may appear at the peripheral portions of the display panel 110. In order to prevent such a shadow area, the light sources 122 may be additionally arranged on the inclined part 172. This will be described later.

Figure 4:
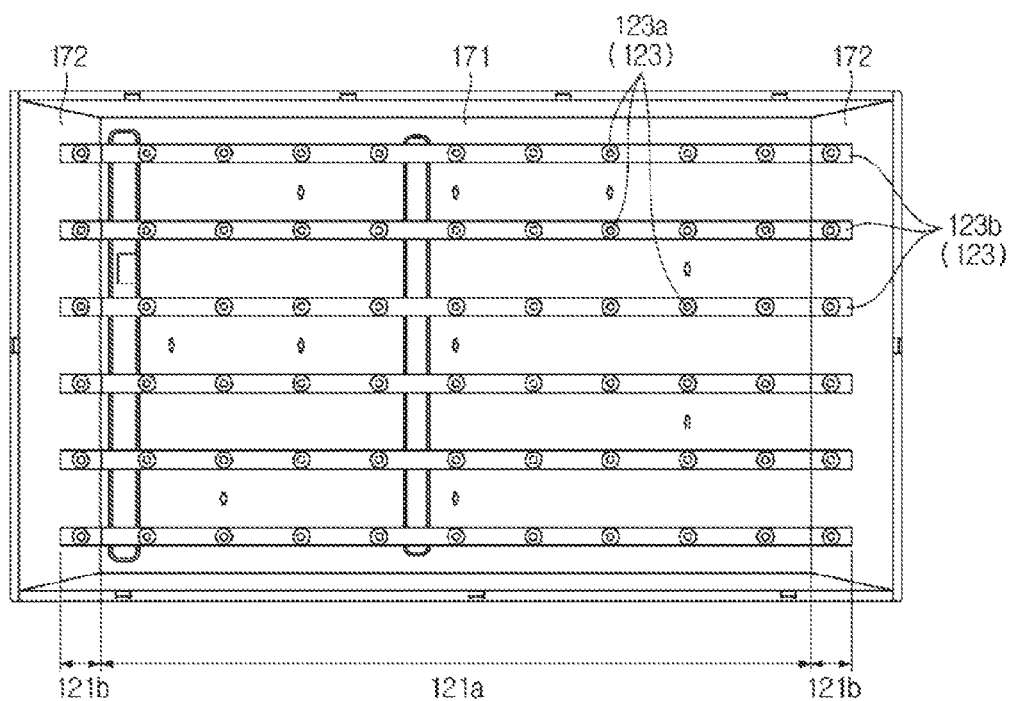
FIG. 4 is a front view showing a configuration of a part of a display module according to an exemplary embodiment.
Figure 5:
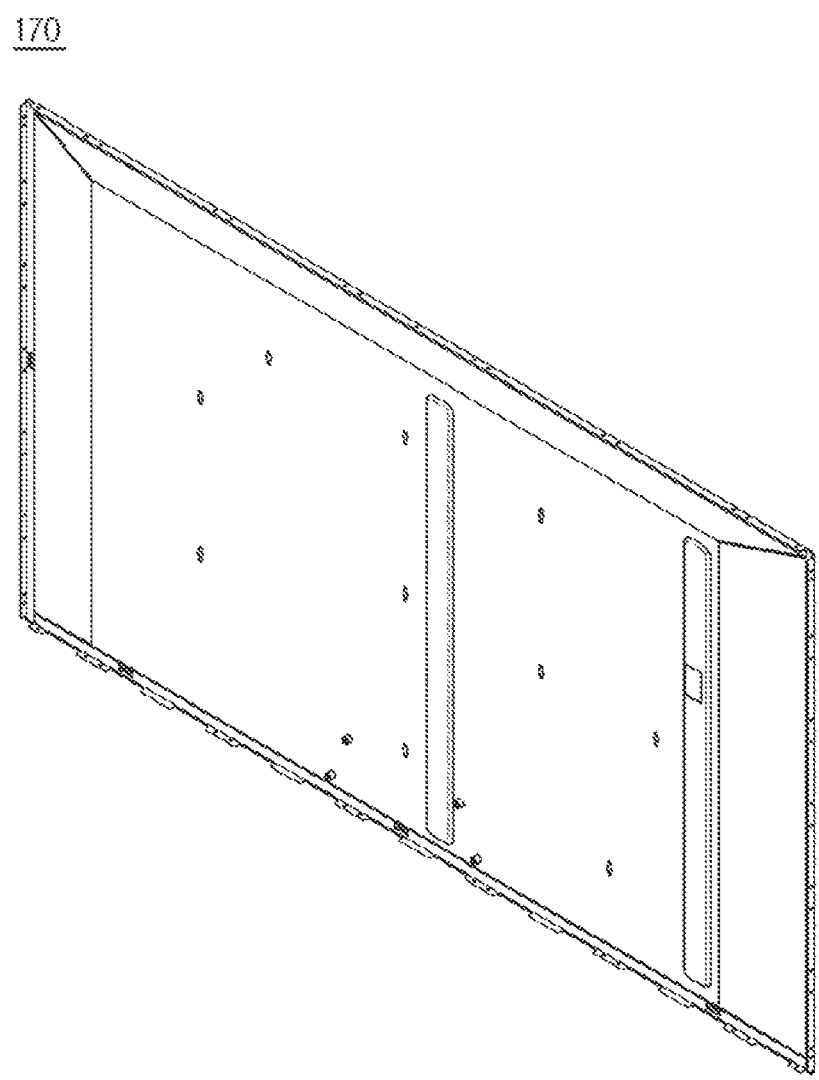
FIG. 5 is a perspective view showing a rear part of a configuration of a part of a display module according to an exemplary embodiment.

FIG. 4 is a front view showing a configuration of a part of the display module 100 according to an exemplary embodiment, FIG. 5 is a front view showing the rear part of the configuration of the part of the display module 100 according to an exemplary embodiment, and FIG. 6 is an enlarged cross-sectional view showing the configuration of the part of the display module 100 according to an exemplary embodiment.

As shown in FIGS. 4 and 5, the PCBs 121 may be supported on the inner surface of the bottom chassis 170. More specifically, the PCBs 121 may extend on the flat part 171 and the inclined part 172 in the inner surface of the bottom chassis 170, in such a way to be rested on the resting grooves formed concavely in the bottom chassis 170.

The inclined part 172 may be inclined at an angle θ of about 10 degrees with respect to the flat part 171. The inclined part 172 may be inclined at an angle of 8 to 15 degrees with respect to the flat part 171.

The angle of the inclined part 172 in consideration of slimming the display apparatus 1. In a general direct type display apparatus, the inclined part of the bottom chassis is inclined at an angle of about 25 degrees. However, by reducing the angle θ of the inclined part 172 by about 10 degrees or more through an arrangement of the backlight unit 120 which will be described later, the display apparatus 1 can be slimmed.

The PCBs 121 may include a first section 121a corresponding to the flat part 171, and a second section 121b extending from both side borders of the first section 121a and inclined at the same angle as that of the inclined part 172 to correspond to the inclined part 172.

The first section 121a and the second section 121b may be coupled with the flat part 171 and the inclined part 172 to contact the flat part 171 and the inclined part 172, respectively. This is aimed at dissipating heat generated from the light sources 122 to the bottom chassis 170 through the PCBs 121.

Accordingly, the bottom chassis 170 may be made of a metal material, such as aluminum or stainless steel, having a high heat transfer rate, to quickly diffuse heat generated from the light sources 122 along the surface to thereby help heat dissipation.

In the second section 121b, at least one light source 122 (also, referred to as a second light source 122b) may be arranged. Also, a plurality of light sources 122b may be arranged with intervals along the width direction of the second section 121b.

Due to the light sources 122b arranged on the second section 121b, some of the light sources 122 may be positioned on the inclined part 172. That is, some of the light sources 122 may be arranged at an inclination of a predetermined angle with respect to the light sources 122 (also, referred to as first light sources 122a) arranged on the flat part 171.

Light emitted from the light sources 122 may be irradiated to the diffusion plate 130. The diffusion plate 130 may diffuse light passing therethrough, and transfer the diffused light to the display panel 110. If an amount of light is non-uniformly irradiated onto the entire area of the diffusion plate 130, non-uniform brightness distribution may appear on the display panel 110 so that some area of the display panel 110 shows different brightness.

Since the light sources 122b arranged in the second section 121b are arranged with an inclination toward the diffusion plate 130 with respect to the light sources 122a arranged in the first section 121a, as described above, the light sources 122b may be positioned closer to the diffusion plate 130 than the light sources 122a.

Accordingly, the light sources 122b arranged in the second section 121b and the light sources 122a arranged in the first section 121a may be located at different distances from the diffusion plate 130. Hence, differences in optical distance from the light sources 122 to the diffusion plate 130 may be made so as not to be able to uniformly irradiate light over the entire area of the diffusion plate 130.

Particularly, as an irradiation distance D is shortened, a range onto which light irradiated in a diagonal direction is transferred may be reduced by the shortened irradiation distance D so that a total area onto which light is transferred is reduced.

If an irradiation distance D of the first light sources 122a is referred to as a first distance D1 and an irradiation distance D of the second light sources 122b is referred to as a second distance D2, the second distance D2 may be shorter than the first distance D1 since the second light sources 122b are located relatively closer to the diffusion plate 130 than the first light sources 122a.

Accordingly, an area onto which light generated by the second light sources 122b is irradiated may be smaller than an area onto which light generated by the first light sources 122a is irradiated, so that the border portions of the diffusion plate 130 onto which light generated by the second light sources 122b is irradiated cannot receive an appropriate amount of light from the second light sources 122b.

Accordingly, as shown in FIG. 4 by differentiating the sizes of the lenses 123 (also, referred to as first lenses 123a) installed on the first light sources 122a from the sizes of the lenses 123 (also, referred to as second lenses 123b) installed on the second light sources 122b to irradiate light onto the outermost border portions of the diffusion plate 130, it is possible to achieve uniform brightness distribution on the display panel 110.

That is, by expanding an angle of irradiation of light through the second lenses 123b, it is possible to sufficiently irradiate light to the border portions of the diffusion plate 130.

More specifically, the diameter of each second lens 123b may be greater than the diameter of each first lens 123a. As the diameter of a lens is greater, an amount of refraction of light may increase so that the light can be radiated to a wider area. (see FIG. 6)

For the same reason, the thickness t2 of the second lens 123b may be thicker than the thickness t1 of the first lens 123a. As the thickness of a lens is thicker, an amount of refraction of light may increase accordingly.

Accordingly, although the distance D2 from the inclined part 172 to the diffusion plate 130 is shorter than the distance D1 from the flat part 161 to the diffusion plate 130, and a smaller number of light sources 122 are arranged in the inclined part 172 than in the flat part 171, light generated by the light sources 122 on the inclined part 171 can be radiated onto a wider area so as to radiate a sufficient amount of light onto the border portions of the diffusion plate 130, resulting in an increase in brightness of the border portions of the display panel 110.

Hereinafter, a display apparatus according to another exemplary embodiment will be described. In the following description, descriptions about the same components as those of the above-described embodiment will be omitted.

Figure 7:
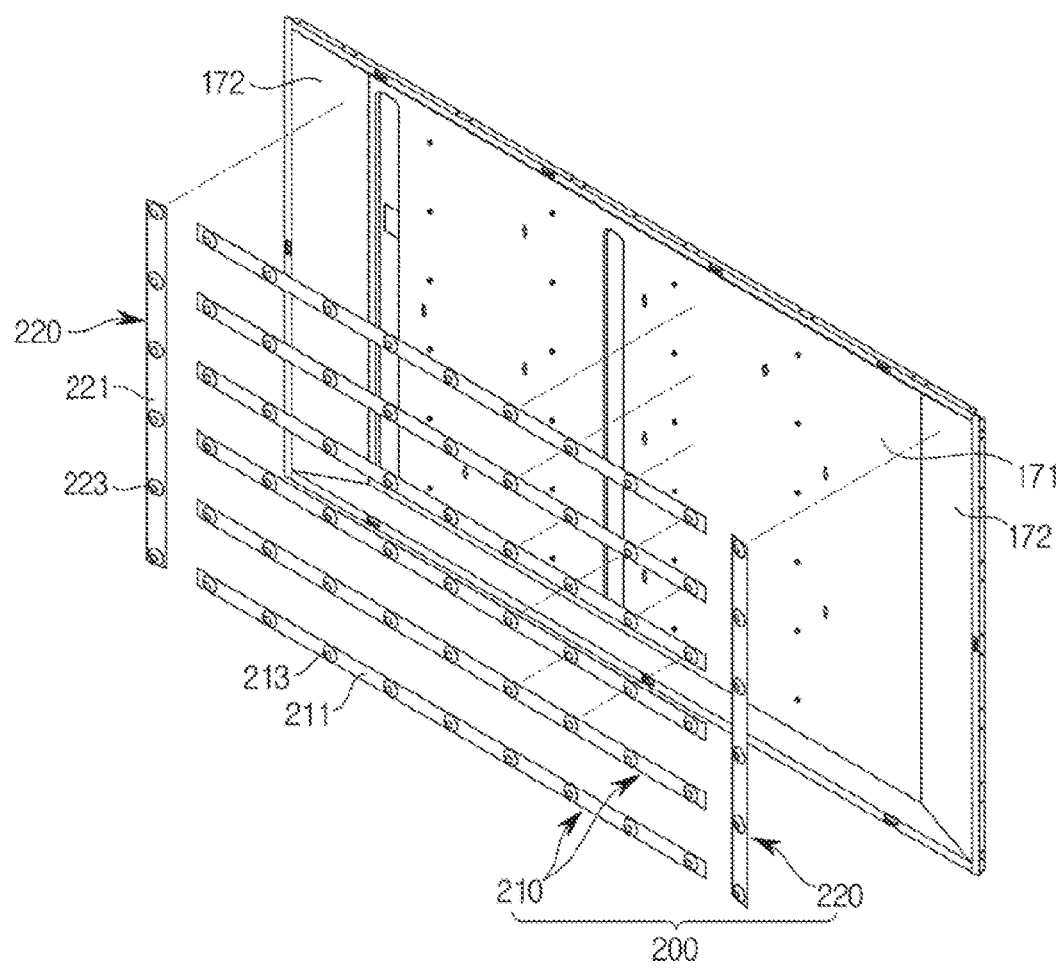
FIG. 7 is an exploded perspective view showing a configuration of a part of a display module according to another exemplary embodiment.
Figure 8:
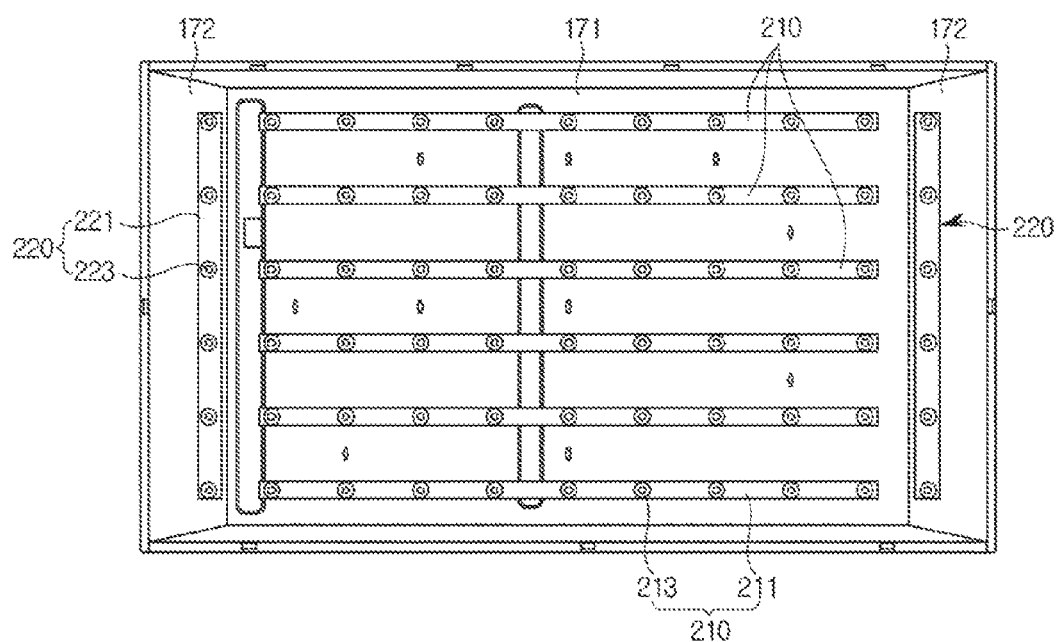
FIG. 8 is a front view showing a configuration of a part of a display module according to another exemplary embodiment.
Figure 9:
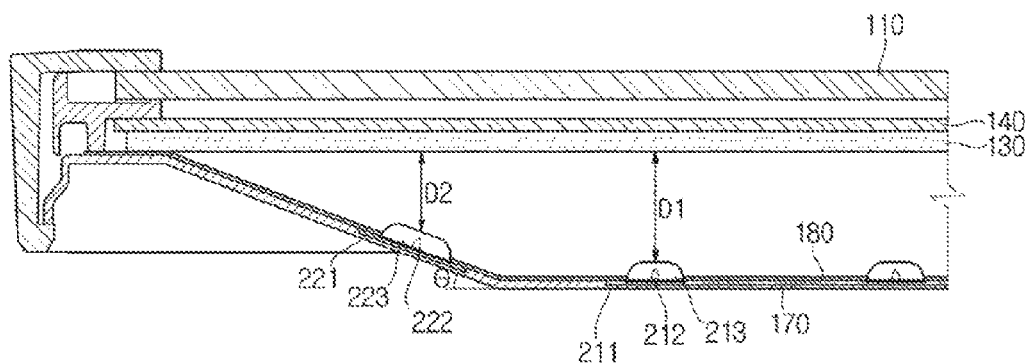
FIG. 9 is an enlarged cross-sectional view showing a configuration of a part of a display module according to another exemplary embodiment.

FIG. 7 is an exploded perspective view showing a configuration of a part of a display module according to another exemplary embodiment, FIG. 8 is a front view showing the configuration of the part of the display module according to another exemplary embodiment, and FIG. 9 is an enlarged cross-sectional view showing the configuration of the part of the display module according to another exemplary embodiment.

As shown in FIGS. 7 and 8, the backlight unit 200 may be supported inside the bottom chassis 170 by the flat part 171 and the inclined part 172.

More specifically, a first backlight unit 210 may be disposed in the flat part 171, and a second backlight unit 220 may be additionally disposed in the inclined part 172.

The first backlight unit 210 may extend in the width (horizontal) direction of the display panel 110 in correspondence to the display panel 110. Also, a plurality of first backlight units 210 may be arranged at intervals in parallel. Each first backlight unit 210 may include a first PCB 211 extending in its length direction, a plurality of flat part light sources 212 arranged on the first PCB 211, and a plurality of flat part lenses 213 installed on the individual flat part light sources 212. The plurality of flat part light sources 212 and the plurality of flat part lenses 213 may be arranged with intervals in the length direction of the first backlight unit 210, and the plurality of first PCBs 211 may be connected to each other through a connection board.

The second backlight unit 220 may extend in the height (vertical) direction of the display panel 220. Accordingly, the second backlight unit 220 may be perpendicular to the first backlight unit 210. However, the second backlight unit 220 may be disposed at an arbitrary angle with respect to the first backlight unit 210, instead of being perpendicular to the first backlight unit 210.

The second backlight unit 220 may be disposed on each of a pair of inclined parts 172 extending from both side borders of the flat part 171. However, a plurality of second backlight units 220 may be arranged with intervals in parallel in the width direction of the display panel 110.

The second backlight unit 220 may include a second PCB 221 extending in its length direction, a plurality of inclined part light sources 222 arranged on the second PCB 221, and a plurality of inclined part lenses 223 installed on the individual inclined part light sources 222. The plurality of inclined part light sources 222 and the plurality of inclined part lenses 223 may be arranged with intervals in the length direction of the second PCB 221, and the plurality of second PCBs 221 may be, like the first PCBs 211, connected to each other through a connection board.

Also, like the above-described embodiment of differentiating the sizes of the first lenses 123*a* from the sizes of the second lenses 123*b*, by differentiating the sizes of the inclined part lenses 223 from the sizes of the flat part lenses 213, it is possible to cancel differences in optical distance made between the inclined part light sources 222 and the flat part light sources 212.

Also, by applying different current to the first PCB 211 and the second PCB 212 to differentiate generation conditions of light of the light sources 212 and the light sources 222 respectively arranged on the first PCB 211 and the second PCB 212, it is possible to uniformly adjust light that is radiated onto the diffusion plate 130.

Although the lenses provided in the flat part 171 and the lenses provided in the inclined part 172 are configured to have the same size, light that is radiated onto the diffusion plate 130 can be adjusted so as to achieve uniform brightness distribution on the display panel 110.

Hereinafter, a display apparatus according to another exemplary embodiment will be described. In the following description, descriptions about the same components as those of the above-described embodiment will be omitted.

Figure 10A:
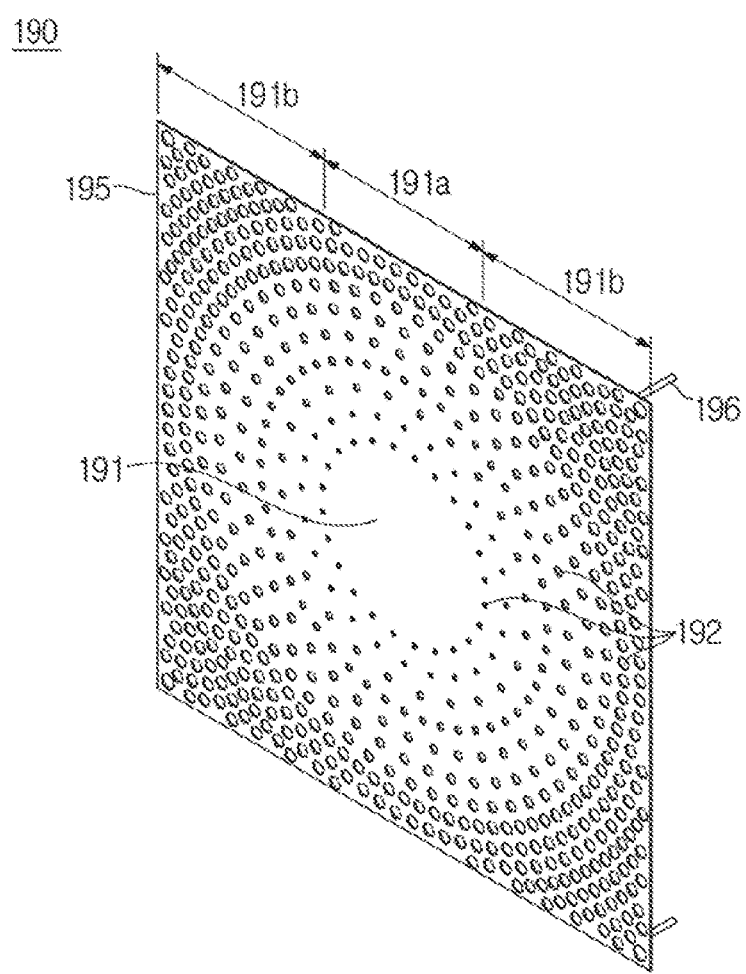
FIG. 10A is a perspective view showing a front part of a second reflective sheet according to another exemplary embodiment.
Figure 10B:
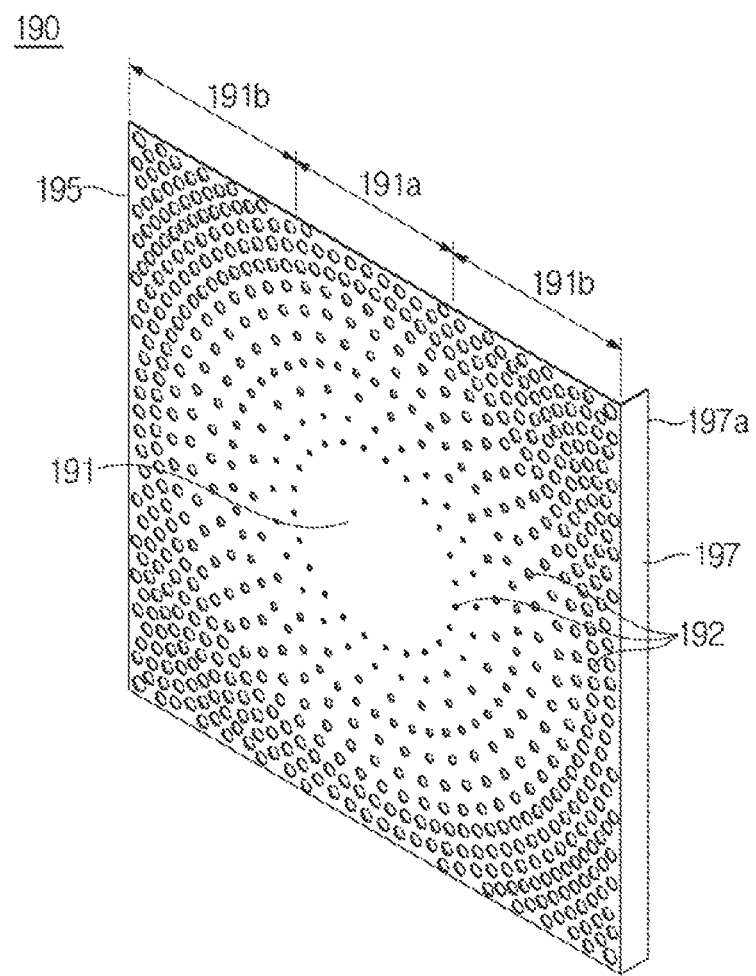
FIG. 10B is a perspective view showing a front part of a second reflective sheet according to another exemplary embodiment.
Figure 11:
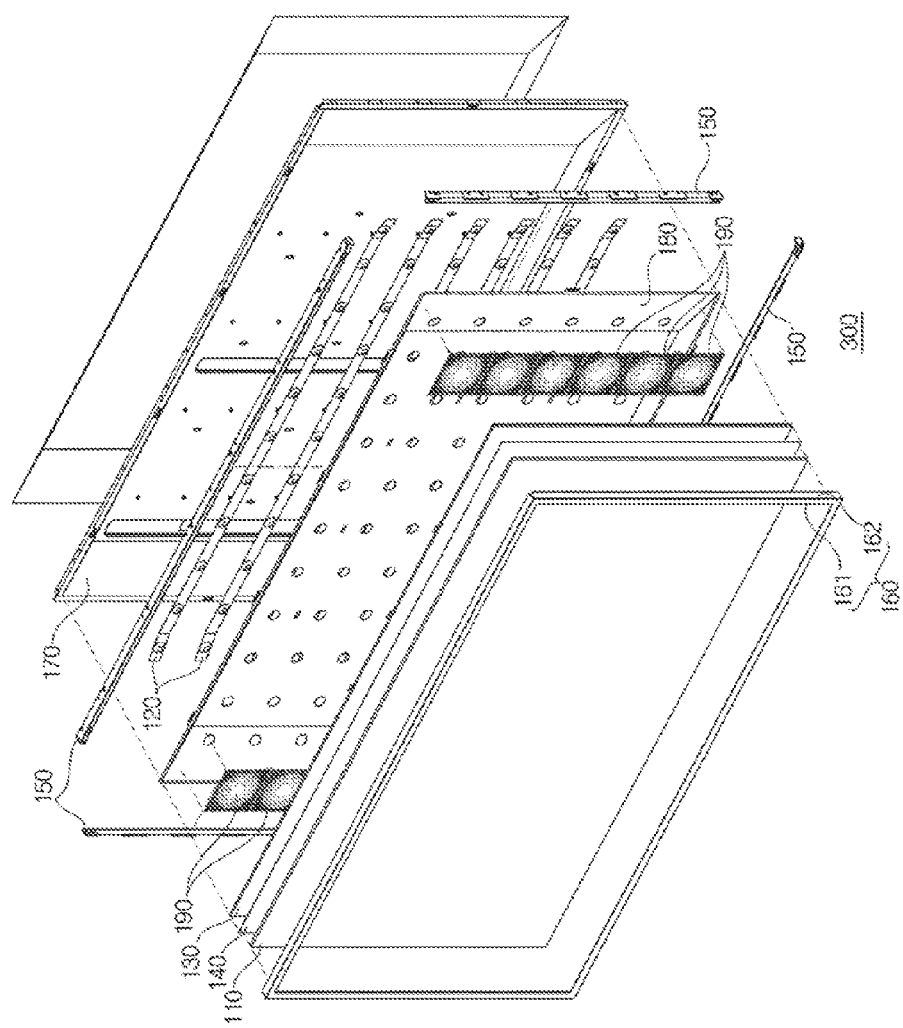
FIG. 11 is an exploded perspective view showing a display module of a display apparatus according to another exemplary embodiment.
Figure 12:
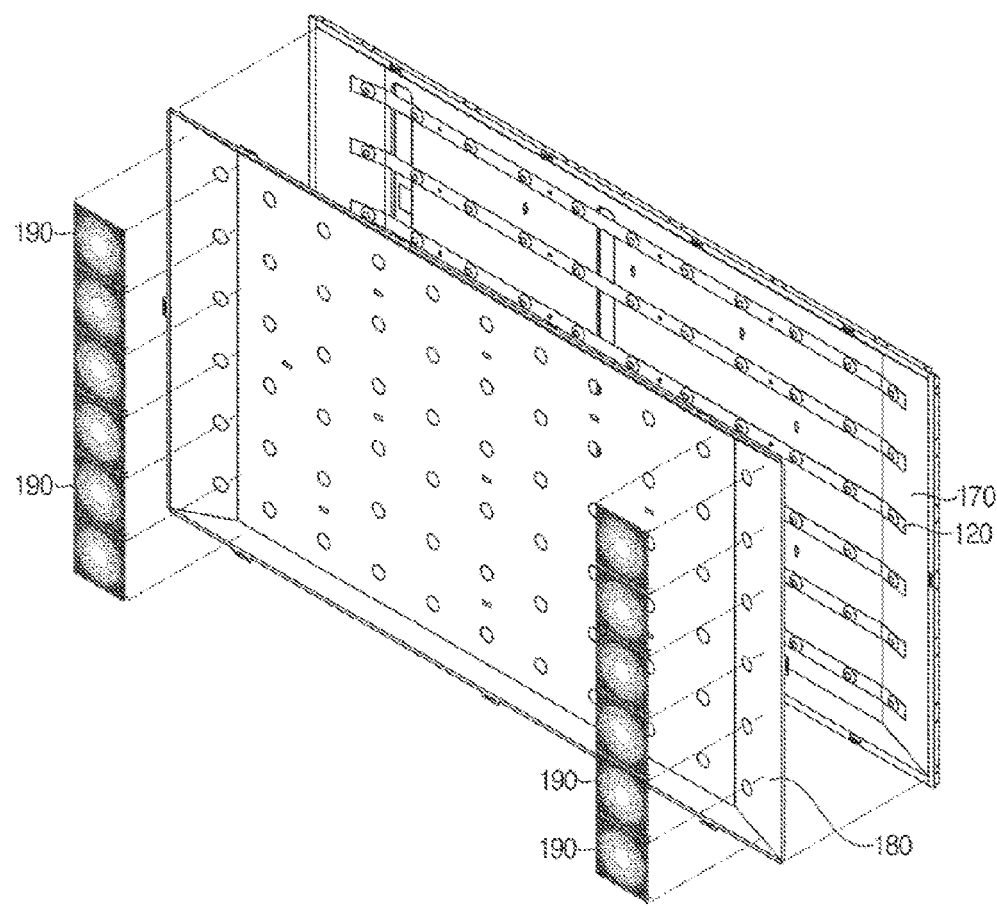
FIG. 12 is an exploded perspective view showing a configuration of a part of a display module according to another exemplary embodiment.
Figure 13:
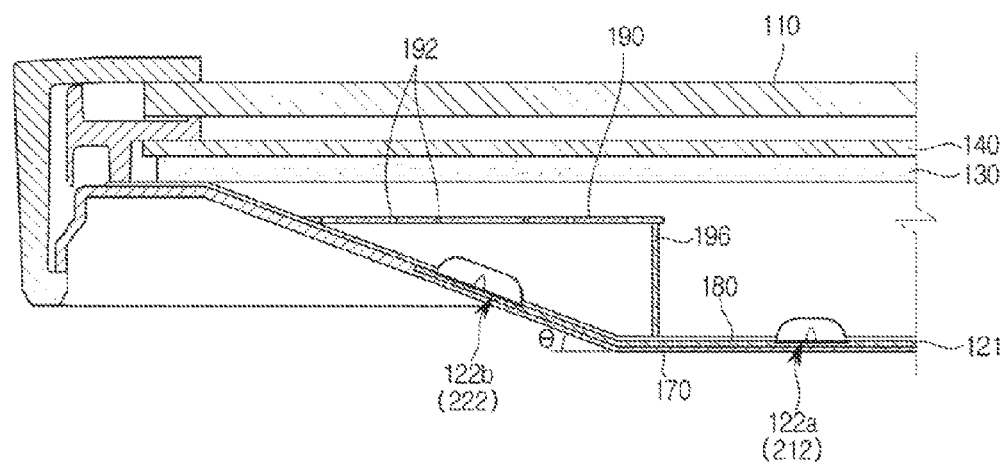
FIG. 13 is a cross-sectional view showing a configuration of a part of a display module according to another exemplary embodiment.

FIG. 10A is a perspective view showing a front part of a second reflective sheet according to another exemplary embodiment, FIG. 10B is a perspective view showing a front part of a second reflective sheet according to another exemplary embodiment, FIG. 11 is an exploded perspective view showing a display module of a display apparatus according to another exemplary embodiment, FIG. 12 is an exploded perspective view showing a configuration of a part of the display module according to another exemplary embodiment, and FIG. 13 is a cross-sectional view showing the configuration of the part of the display module according to another exemplary embodiment.

A second reflective sheet 190 shown in FIG. 10A may be disposed in a inclined part 172 located in the left portion of a display module 300, and a second reflective sheet 190 located in the right portion of the display module 300 may be symmetrical to the second reflective sheet 190 of FIG. 10A.

In order to achieve uniform brightness distribution throughout the entire area of the display panel 110, the inclined part light sources 222 (also, referred to as the second light sources 222*b*) may be provided in the inclined part 172, as described above.

Since light generated from the inclined part light sources 222, unlike the flat part light sources 212 (also, referred to as the second light sources 212*a*) arranged on the flat part 171, is radiated at a predetermined angle with respect to the display panel 110, the light cannot be uniformly radiated onto the border portions of the display panel 110 corresponding to the inclined part light sources 222.

Also, since the plurality of light sources 122 arranged on the flat part 171 are located adjacent to each other, light radiated from the adjacent light sources 122 may overlap so that a nearly uniform amount of light can be radiated onto the center portion of the display panel 110 corresponding to the flat part 171.

However, since a smaller number of light sources 122 are arranged in the inclined part 172 than in the flat part 171, the effect of uniformizing light due to overlapping of light radiated from adjacent light sources cannot be obtained. Accordingly, light cannot be uniformly radiated onto the border portions of the display panel 110 rather than the center portion of the display panel 110.

In order to acquire an uniform amount of light in the border portions of the display panel 110, the display module 300 may further include the second reflective sheet 190.

The second reflective sheet 190 may be provided between the display panel 110 and the first reflective sheet 180. More specifically, the second reflective sheet 190 may be disposed on a light path between the diffusion plate 130 and the inclined part light sources 222.

There may be provided a plurality of second reflective sheets 190 to respectively correspond to the plurality of inclined part light sources 220 arranged on the inclined part 171. Accordingly, the number of the second reflective sheets 190 may correspond to the number of the inclined part light sources 220.

On one surface of the second reflective sheet 190 facing the first reflective sheet 180, a reflective surface 191 may be formed with a material capable of effectively reflecting light.

The second reflective sheet 190 may again reflect light radiated from the inclined part light sources 222 and proceeding toward the diffusion plate 130, and light reflected from the first reflective sheet 180, so as to direct the reflected light toward the first reflective sheet 180.

Also, a part of light radiated from the flat part light sources 212 may be irradiated onto the second reflective sheet 190.

The light reflected and then irradiated onto the first reflective sheet 180 may be again reflected by the first reflective sheet 180, transmitted through the second reflective sheet 190 toward the diffusion plate 130, and then irradiated onto the diffusion plate 130.

Light may be reflected by the first reflective sheet 180 and the second reflective sheet 190 one time and then irradiated onto the diffusion plate 130. Also, light may be repeatedly reflected by the first reflective sheet 180 and the second reflective sheet 190 several times, transmitted through the second reflective sheet 190, and then irradiated onto the diffusion plate 130.

The second reflective sheet 190 may include a plurality of through holes 192 through which light is transmitted and irradiated onto the diffusion plate 130. A part of light radiated to the second reflective sheet 190 may be reflected from the reflective surface 191 toward the first reflective sheet 180, and the other part of the light may be irradiated onto the diffusion plate 130 through the through holes 192.

The through holes 192 may be divided into a center part 191a located in the center portion of the reflective surface 191 of the second reflective sheet 190, and an edge part 191b extending outward from the center part 191a. The center part 191a may correspond to the location of the inclined part light source 222, and the edge part 191b may correspond to the outside of the circumference of the inclined part light source 222.

However, the center part 191a and the edge part 191b may be, instead of being definitely divided based on the radius of the circumference of the inclined part light source 222, determined in consideration of the size and thickness of the display module 300.

Since a majority of light is radiated from the center of the inclined light source 222, a hot spot appearing as a brighter area than the other area may be made on an area on the display panel 110 corresponding to the center of the inclined part light source 222.

The reason is because the amount of light is cancelled by the adjacent inclined part light sources 222 so that an uniform amount of light cannot be radiated, unlike the flat part light sources 212, as described above.

In order to overcome the problem, no through holes 192 may be formed in the center portion of the center part 191a corresponding to the center portion of the inclined part light source 222. Therefore, a large amount of light radiated from the inclined part light source 222 may be not directly radiated to the diffusion plate 130.

Since light radiated from the inclined part light source 222 is transmitted through the second reflective sheet 190 and then radiated to the display panel 110, a relatively smaller amount of light can be radiated to the edge portions 172 of the display panel 110 than that radiated to the center portion of the display panel 110 corresponding to the flat part 171.

Accordingly, by applying different amounts of electricity to the inclined part light sources 222 and the flat part light sources 212, respectively, it is possible to adjust an irradiation amount of light, as described above.

The through holes 192 may be gradually arranged toward the borders of the second reflective sheet 190, starting from a location spaced by a predetermined distance from the center of the center part 191a.

As described above, a large amount of light may be radiated from the center of the inclined part light source 222 corresponding to the center part 191a, while a relatively small amount of light may be radiated from the edge portion of the inclined part light source 190 corresponding to the edge part 191b. Accordingly, in the edge part 191b, a larger amount of light may need to be radiated toward the diffusion plate 130 than in the center part 191a, with respect to an amount of light generated by the inclined part light source 222, in order to uniformly radiate light over the entire area of the diffusion plate 130 corresponding to the inclined part light source 222.

Accordingly, the through holes 192 located closer to the center of the center part 191a may have the smaller diameters, and the through holes 192 located closer to the outermost area of the edge part 191b may have the larger diameters. Also, the number of the through holes 192 arranged in the edge part 191b may be greater than that of the through holes 192 arranged in the center part 191a.

That is, the through holes 192 having the smaller diameters may be arranged in the center part 191a to reduce an amount of light to be transmitted with respect to a total amount of radiated light by a predetermined amount, and the through holes 192 having the greater diameters may be arranged in the edge part 191b to which a small amount of light is radiated to transmit a relatively large amount of light with respect to the total amount of radiated light.

However, the through holes 192 may be arranged in various patterns according to the size and thickness of the display module 300.

The second reflective sheet 190 may be disposed between the display panel 110 and the inclined part light source 222, as described above. Accordingly, the second reflective sheet 190 may include a contact part 195 extending from its one side edge such that the second reflective sheet 190 is supported on the inclined part 172 at the side edge.

The contact part 195 may contact one side edge of the inclined part 172 when the display module 300 is assembled. In the inclined part 172, a contact groove may be formed to correspond to the contact part 195, at an area at which the inclined part 172 contacts the contact part 195, so that the second reflective sheet 190 can be rested on the inclined part 172.

However, the contact part 195 may be coupled with the inclined part 172 by an adhesive such as glue. Also, the second reflective sheet 190 may include an additional coupling unit to be coupled with the inclined part 172 by screw coupling.

In the other side edge of the second reflective sheet 190, a contact bar 196 may extend vertically toward the flat part 171. Since no component for supporting the second reflective sheet 190 laterally exists at the other side edge of the second reflective sheet 190, the contact bar 196 may be used to support the second reflective sheet 190 on the flat part 171 located below the other side edge of the second reflective sheet 190.

The contact bar 196 may extend vertically from the rear part of the second reflective sheet 190 to contact the surface of the flat part 171. At a location of the flat part 171 corresponding to the contact bar 196, a contact groove may be formed to rest the contact bar 196 therein.

However, the contact bar 196 may be attached on the flat part 171 by an adhesive such as glue. Also, the second reflective sheet 190 may include an additional coupling unit to be coupled with the flat part 171 by screw coupling.

FIG. 10B shows a second reflective sheet 190 according to another exemplary embodiment. Referring to FIG. 10B, a bent part 197 bent vertically and extending from the other side edge of the second reflective sheet 190, instead of the contact bar 196, may be provided.

The bent part 197 may extend vertically toward the flat part 171, like the contact bar 196, and the side end 197a of the bent part 197 may contact the surface of the flat part 171. In the flat part 171, a contact groove may be formed to correspond to the side end 197a of the bent part 197, at an area at which the side end 197a of the bent part 197 contacts the flat part 171, so that the second reflective sheet 190 can be rested on the flat part 171.

In the bent part 197 positioned vertical to the reflective surface 191, a plurality of through holes 192 may be, unlike the current embodiment, formed so that light radiated from the inclined part light source 222 can be transmitted toward the flat part 171 or light radiated from the flat part light source 212 can be transmitted to the inclined part 172.

The through holes 192 of the bent part 197 may be formed with various sizes and shapes.

Also, the contact bar 196 or the bent part 197 may extend upward and downward, instead of extending backward, so that the second reflective sheet 190 can be supported by the middle mold 150 or by the upper and lower side edges of the bottom chassis 170.

Figure 14A:
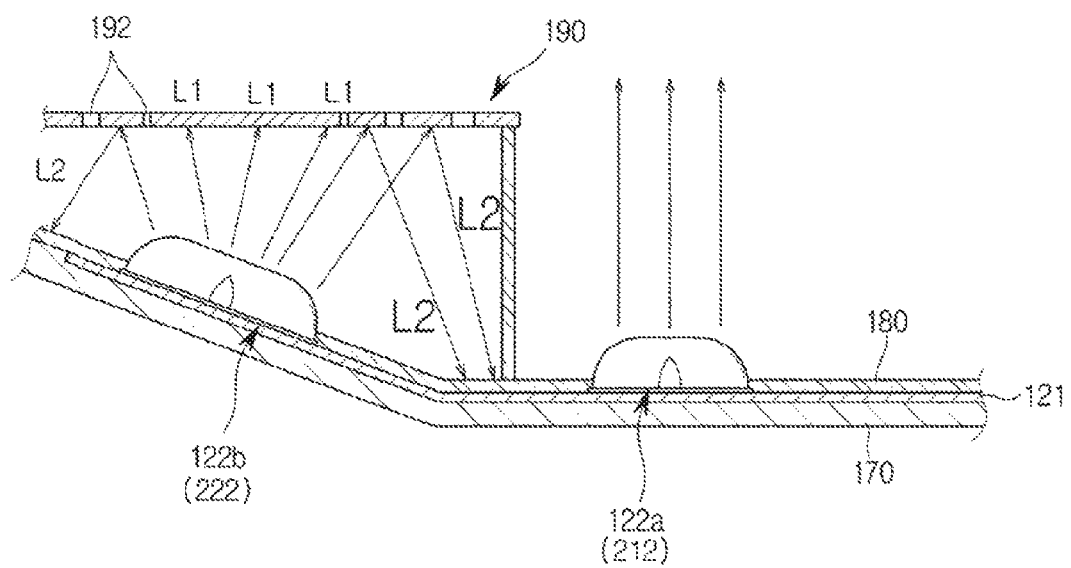
FIG. 14A is a view for describing a concept in which light radiated from a light source according to another exemplary embodiment is emitted toward a reflective surface of a second reflective sheet.
Figure 14B:
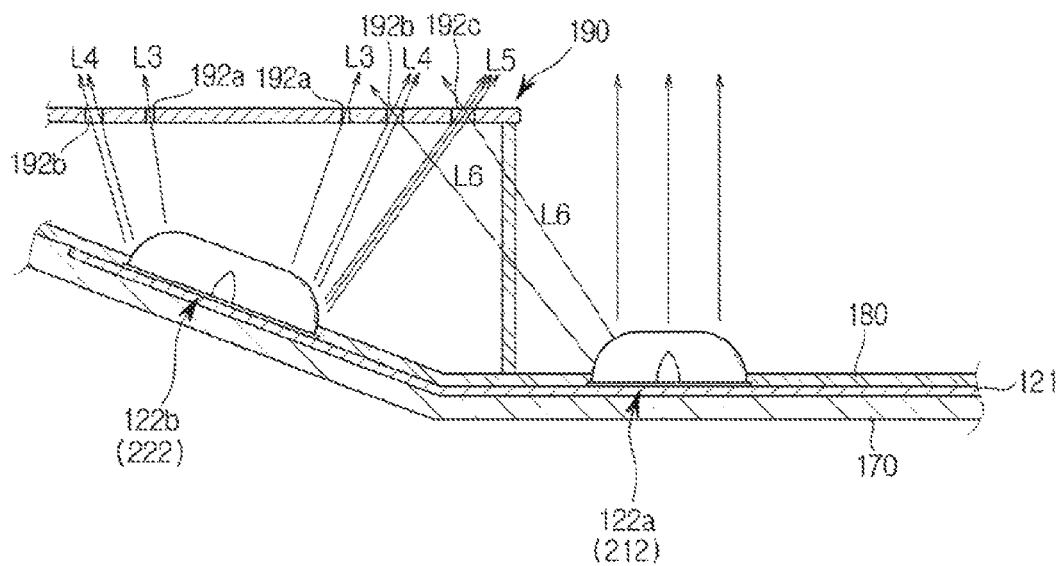
FIG. 14B is a view for describing a concept in which light is transmitted through a second reflective sheet according to another exemplary embodiment.
Figure 15:
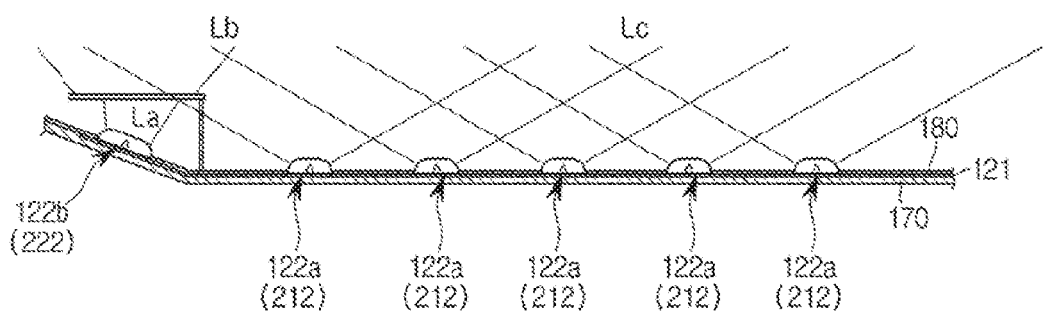
FIG. 15 is a view for describing a concept in which light is radiated from a plurality of light sources according to another exemplary embodiment.

FIG. 14A is a view for describing a concept in which light radiated from a light source according to another exemplary embodiment is emitted toward the reflective surface 191 of the second reflective sheet 190, FIG. 14B is a view for describing a concept in which light is transmitted through the second reflective sheet 190 according to another exemplary embodiment, and FIG. 15 is a view for describing a concept in which light is radiated from a plurality of light sources according to another exemplary embodiment.

As shown in FIG. 14A, a large amount of light L1 generated from the center of the inclined part light source 222 may be irradiated onto the center part 191a of the second reflective sheet 190. As described above, since no through holes 192 are formed in the center portion of the center part 191a, the light L1 may be not radiated toward the diffusion plate 130.

In a direction from the center of the center part 191a to the edge part 191b, the number of the through holes 192 may increase, and the diameters of the through holes 192 may also increase. That is, the diameters of the through holes 192 may increase in the order of 192c>192b>192a.

Accordingly, an amount of light L5 transmitted through the through hole 192c formed in the edge part 191b may be more than an amount of light L3 transmitted through the through hole 192a formed around the center part 191a.

However, since the center of the inclined part light source 222 corresponds to the center part 191a, an amount of light radiated toward the center part 191a may be more than an amount of light radiated toward the edge part 191b so that a total amount of light transmitted through the second reflective sheet 190 can be uniformly maintained throughout the center part 191a and the edge part 191b.

In the center of the center part 191a, light L1 radiated directly from the inclined part light source 222 may not be transmitted. Also, light L2 irradiated onto a location not corresponding to any through hole 192 may be not transmitted through the second reflective sheet 190.

However, the light L1 and L2 not transmitted through the through holes 192 may be reflected by the reflective surface 191 and radiated toward the inclined part light source 222. Then, the light L1 and L2 may be reflected by the first reflective sheet 180, and again directed toward the second reflective sheet 190.

A part of light transmitted through the second reflective sheet 190 by single or multiple reflections may be radiated toward an area of the display panel 110 corresponding to the center part 191a according to an angle of reflection of the light, so that a constant amount of light can be radiated toward the display panel 110.

Also, some light L6 generated from the flat part light source 212 may be emitted toward the second reflective sheet 190 and transmitted through the through hole 192 so as to be radiated toward the area of the display panel 110 corresponding to the center part 191a.

FIG. 15 schematically shows light radiated from the flat part light source 212 and the inclined part light source 222. Light Lc radiated from the flat part light source 212 may overlap with light radiated from the adjacent light sources 212 so that a nearly constant amount of light can be radiated toward the area of the display panel 110 corresponding to the flat part 171.

However, since the inclined part light source 222 is inclined with respect to the display panel 110, as described above, light generated from the inclined part light source 222 may be intensively radiated onto a specific location. Also, since the number of light sources arranged adjacent to each other is small, a constant amount of light La cannot be radiated toward the area of the display panel 110 corresponding to the inclined surface 172.

In order to overcome the problem, the second reflective sheet 190 may be disposed between the inclined part light source 222 and the display panel 110.

Accordingly, when light La radiated from the inclined part light source 222 is transmitted through the second reflective sheet 190, a transmission amount of light can be adjusted by the through holes 192, and light Lb transmitted through the second reflective sheet 190 can be radiated with a nearly constant amount toward the display panel 110, due to light reflected and transmitted between the first reflective sheet 180 and the second reflective sheet 190.

Hereinafter, another exemplary embodiment will be described. In the following description, descriptions about the same components as those of the above-described embodiment will be omitted.

Figure 16:
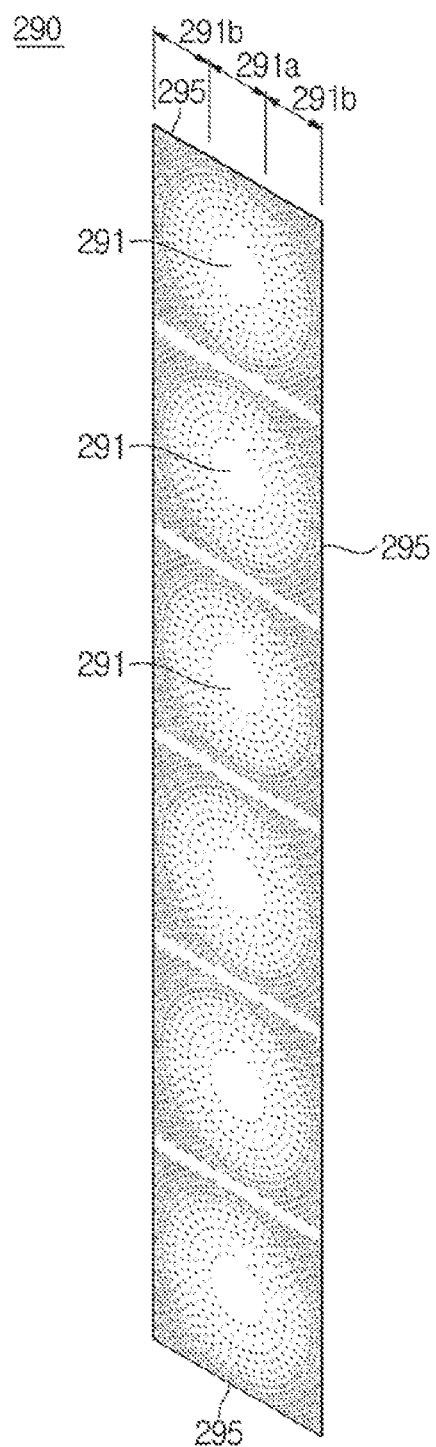
FIG. 16 is a perspective view of a second reflective sheet according to another exemplary embodiment.
Figure 17:
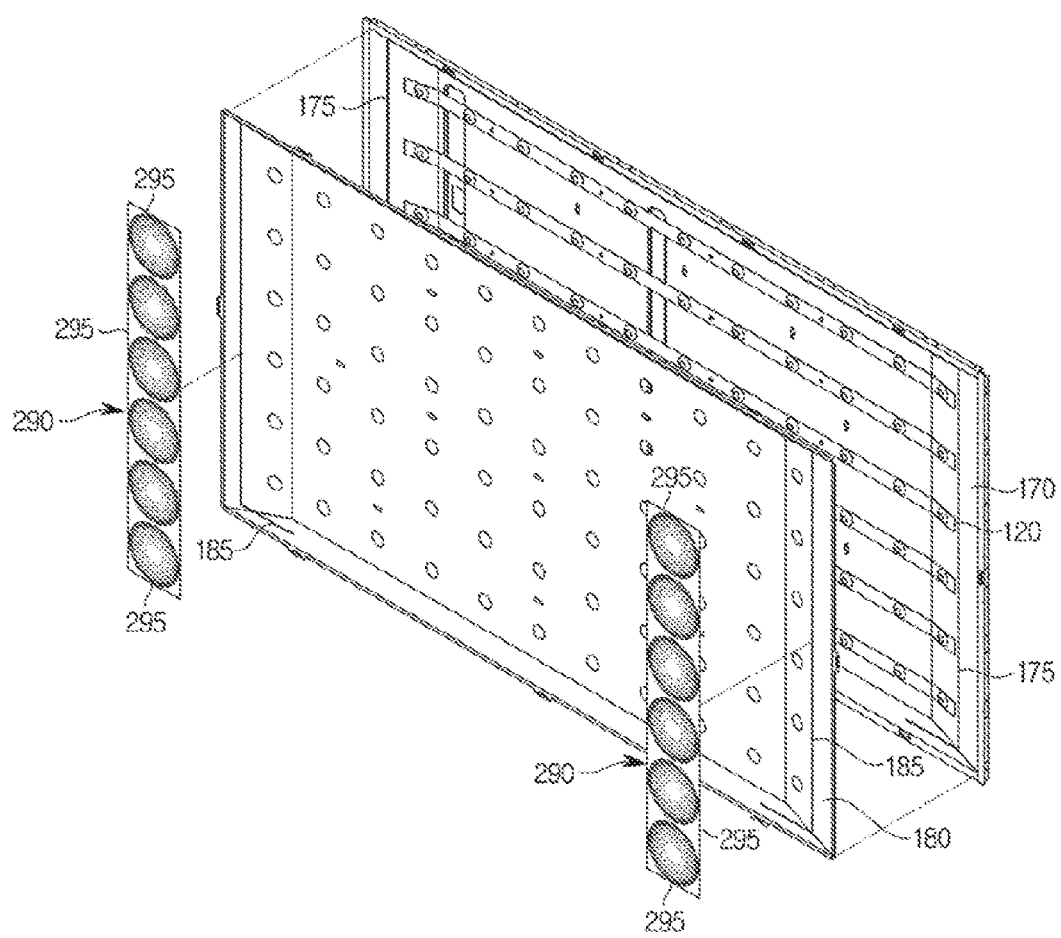
FIG. 17 is an exploded perspective view showing a configuration of a part of a display module according to another exemplary embodiment.
Figure 18:
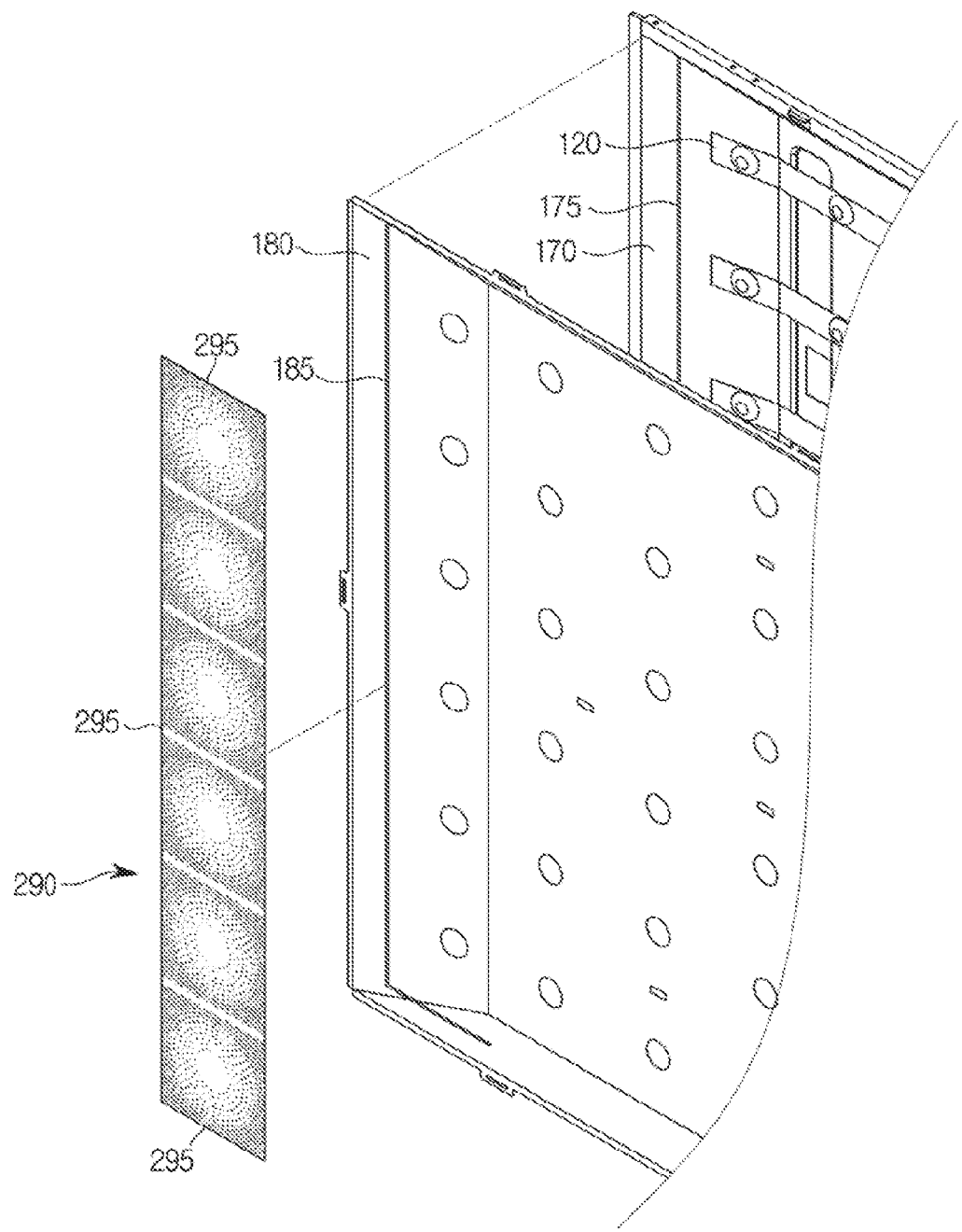
FIG. 18 is an enlarged perspective view showing a configuration of a part of a display module according to another exemplary embodiment.

FIG. 16 is a perspective view of a second reflective sheet according to another exemplary embodiment, FIG. 17 is an exploded perspective view showing a configuration of a part of a display module according to an exemplary embodiment, and FIG. 18 is an enlarged perspective view showing the configuration of the part of the display module according to another exemplary embodiment.

A second reflective sheet 290 shown in FIG. 16 may be provided to correspond to the inclined part 172 located in the right portion of the display module 300, and a second reflective sheet 290 provided to correspond to the inclined part 172 located in the left portion of the display module 300 may be symmetrical to the second reflective sheet 290 shown in FIG. 16.

Referring to FIGS. 16, 17, and 18, the second reflective sheet 290 may be formed with a plate of a size corresponding to the vertical length of the inclined part 172. Unlike the second reflective sheet 190 according to the above-described embodiment, the second reflective sheet 290 according to another exemplary embodiment may be provided in each of the pair of inclined parts 172 provided in both side edges of the display module 300.

The second reflective sheet 290 may include a plurality of center parts 291a respectively positioned at locations corresponding to the plurality of inclined part light sources 222, and a plurality of edge parts 291b extending outward from the circumferences of the center parts 291a.

Each center part 291a and each edge part 291b may respectively have the same technical features as the center part 191*a* and the edge part 191*b* of the above-described embodiment, and accordingly, a detailed description thereof will be omitted.

In one side edge and upper and lower edges of the second reflective sheet 290, a resting part 295 extending outward from the second reflective sheet 290 may be respectively provided to rest the second reflective sheet 290 on the inclined part 172. More specifically, one side border and upper and lower borders of the second reflective sheet 290, adjacent to the inclined part 172, may be formed as a resting part 295 so as to pass through the first reflective sheet 180 and to be rested on the bottom chassis 170 and supported by the bottom chassis 170.

In order to rest the second reflective sheet 290 on the bottom chassis 170, the first reflective sheet 180 may include a resting hole 185 through which the resting part 295 can pass and which has a size corresponding to the resting part 295.

Also, in the bottom chassis 170, a resting groove 175 may be formed with a size corresponding to the size of the resting part 295, at a location corresponding to the resting part 295 passed through the resting hole 185, so that the resting part 295 can be partially inserted into the bottom chassis 170 and rested on the bottom chassis 170.

Accordingly, the second reflective sheet 290 may be rested on the bottom chassis 170 to be disposed between the inclined part light sources 222 and the display panel 110, so that an uniform amount of light can be radiated to the area of the display panel 110 corresponding to the inclined part light sources 222.

In the display apparatus (for example, a slim display apparatus) according to the exemplary embodiments, by providing the backlight unit in the inclined part formed in the rear part of the display apparatus, it is possible to effectively transmit light to the entire area of the display panel, resulting in an improvement in efficiency of the display apparatus.

Although a few exemplary embodiments have been shown and described, it would be appreciated by those skilled in the art that changes may be made in these embodiments without departing from the principles and spirit of the disclosure, the scope of which is defined in the claims and their equivalents.

What is claimed is:

1. A display apparatus comprising:
    a display panel;
    a chassis comprising a flat part and an inclined part that extends from a side border of the flat part and is inclined with respect to the flat part;
    at least one printed circuit board (PCB) disposed on the chassis; and
    a plurality of light sources arranged on the at least one PCB and configured to emit light toward the display panel,
    wherein at least one light source of the plurality of light sources is arranged at a position corresponding to the inclined part of the chassis, and
    wherein the display apparatus comprises a plurality of lenses respectively installed on the plurality of light sources,
    wherein a size of at least one lens, among the plurality of lenses, installed on the at least one light source arranged on the inclined part is greater than the size of other lenses among the plurality of lenses, installed on other light sources of the plurality of light sources arranged on a portion of the at least one PCB which is disposed on the flat part.

2. The display apparatus according to claim 1, wherein the at least one PCB extends across the flat part of the chassis in a longitudinal direction of the chassis to a part of the inclined part of the chassis.

3. The display apparatus according to claim 2, wherein the at least one PCB includes a first section corresponding to the flat part, and a second section that is inclined corresponding to the inclined part of the chassis.

4. The display apparatus according to claim 3, wherein the second section is inclined at an angle of 8 degrees to 15 degrees with respect to the first section.

5. The display apparatus according to claim 3, wherein the plurality of light sources are arranged at intervals along a longitudinal direction of the at least one PCB, and the at least one light source of the plurality of light sources is arranged in the second section.

6. The display apparatus according to claim 1, wherein the at least one PCB comprises:
    a first PCB disposed on the flat part of the chassis, and
    a second PCB disposed on the inclined part of the chassis.

7. The display apparatus according to claim 6, wherein the second PCB disposed on the inclined part has its longest side in a height direction of the chassis, and is positioned in the height direction of the chassis.

8. The display apparatus according to claim 6, wherein the at least one light source comprises a plurality of light sources arranged on the second PCB at intervals in a height direction of the chassis.

9. The display apparatus according to claim 1, wherein a diameter of at least one lens, among the plurality of lenses, installed on the at least one light source arranged at the position corresponding to the inclined part is greater than diameters of other lenses, among the plurality of lenses, installed on other light sources of the plurality of light sources arranged on a portion of the at least one PCB which is disposed on the flat part.

10. The display apparatus according to claim 9, wherein a thickness of the at least one lens is thicker than thicknesses of the other lenses.

11. The display apparatus according to claim 1, further comprising:
    a first reflective sheet disposed on the chassis, and configured to reflect light emitted by the plurality of light sources toward the display panel; and
    a second reflective sheet disposed between the first reflective sheet and the display panel.

12. The display apparatus according to claim 11, wherein the second reflective sheet is located at a position corresponding to the inclined part, and comprises a plurality of through holes through which light emitted by the plurality of light sources and light reflected by the first reflective sheet are transmitted.

13. The display apparatus according to claim 12, wherein the plurality of through holes are arranged in a center part and an edge part of the second reflective sheet, and
    diameters of the plurality of through holes arranged in the center part of the second reflective sheet are smaller than diameters of the plurality of through holes arranged in the edge part of the second reflective sheet.

14. The display apparatus according to claim 13, wherein in a direction from the center part of the second reflective sheet to the edge part of the second reflective sheet, the diameters of the plurality of through holes increase.

15. A display apparatus comprising:
    a display panel; and
    a backlight unit comprising a plurality of light sources configured to emit light toward the display panel and comprises a plurality of lenses respectively installed on the plurality of light sources and configured to diffuse light emitted by the plurality of light sources, wherein a first section of the backlight unit is disposed on a plane parallel to the display panel as a flat part, a second section of the backlight unit extends from a border of the first section and is inclined with respect to the first section as an inclined part, and the plurality of light sources are arranged on the first section and the second section wherein the backlight unit extends across the flat part in a longitudinal direction of the backlight unit to a part of the inclined part in a continuous manner and at least one lens arranged on the second section of the backlight unit diffuses a larger amount of light than a plurality of lenses arranged on the first section of the backlight unit.

16. The display apparatus according to claim 15, wherein the backlight unit extends in a width direction of the display panel.

17. A display apparatus comprising:
- a display panel; and
- a plurality of backlight unit, each of the plurality of backlight units comprising a plurality of light sources configured to emit light toward the display panel,
- wherein a first backlight unit, among the plurality of backlight unit, is disposed on a first plane parallel to the display panel and extends in a width direction of the display panel, and a second backlight unit, among the plurality of the backlight units, is disposed on a second plane inclined with respect to the first plane and extends in a height direction of the display panel,
- wherein the display apparatus comprises a plurality of lenses respectively installed on the plurality of light sources,
- wherein a size of at least one lens, among the plurality of lenses, installed on the at least one light source arranged on the second plane is greater than the size of other lenses among the plurality of lenses, installed on other light sources of the plurality of light sources arranged on a portion of the at least one PCB which is disposed on the first plane.

18. The display apparatus according to claim 17, wherein each of the backlight units comprises a plurality of lenses respectively installed on the plurality of light sources, and configured to diffuse light generated from the plurality of light sources, and
- the lenses of the second backlight unit diffuse a larger amount of light than the lenses of the first backlight unit.

19. The display apparatus according to claim 15, further comprising:
- a first reflective sheet disposed behind the plurality of light sources, and configured to reflect the light emitted from the plurality of light sources toward the display panel; and
- a second reflective sheet disposed between the display panel and the first reflective sheet, and configured to reflect light emitted from the plurality of light sources and the light reflected by the first reflective sheet to the first reflective sheet.

* * * * *